US011716105B2

(12) United States Patent
Chen et al.

(10) Patent No.: US 11,716,105 B2
(45) Date of Patent: Aug. 1, 2023

(54) RADIO FREQUENCY SWITCH WITH MULTIPLE SHUNT PATHS SHARING A COMMON GROUND PAD

(71) Applicant: RichWave Technology Corp., Taipei (TW)

(72) Inventors: Chih-Sheng Chen, Taipei (TW); Yu-Hsiang Chu, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/542,463

(22) Filed: Dec. 5, 2021

(65) Prior Publication Data

US 2023/0123320 A1 Apr. 20, 2023

(30) Foreign Application Priority Data

Oct. 20, 2021 (TW) .................................. 110138873

(51) Int. Cl.
 *H04B 1/04* (2006.01)
 *H04B 1/40* (2015.01)
 (Continued)

(52) U.S. Cl.
 CPC ......... *H04B 1/0483* (2013.01); *H04B 1/1607* (2013.01); *H04B 1/44* (2013.01)

(58) Field of Classification Search
 CPC .......... H04B 1/02; H04B 1/04; H04B 1/0458; H04B 1/0475; H04B 1/0483;
 (Continued)

(56) References Cited

U.S. PATENT DOCUMENTS 5,903,178 A 5/1999 Miyatsuji
7,391,282 B2 * 6/2008 Nakatsuka ......... H03K 17/6871
 333/101

(Continued)

FOREIGN PATENT DOCUMENTS

CN 107517060 A 12/2017
JP 2003-101304 A 4/2003
TW 201409939 A 3/2014

OTHER PUBLICATIONS

Office action dated Mar. 31, 2022 for the Taiwan application No. 110138873, filing date Oct. 20, 2021, pp. 1-6.

(Continued)

*Primary Examiner* — Quochien B Vuong
(74) *Attorney, Agent, or Firm* — Winston Hsu

(57) ABSTRACT

A radio frequency switch has an antenna end, a first signal end for transmitting a first radio frequency signal, a second signal end for transmitting a second radio frequency signal, a third signal end for transmitting a third radio frequency signal, a first series path having a first switch, a second series path having a second switch, a third series path having a third switch, a first shunt path coupled between the first signal end and a node, a second shunt path coupled between the second signal end and the node, a common path coupled between the node and a first reference voltage end, and a third shunt path coupled between the third signal end and a second reference voltage end. The first series path and the second series path are connected to a common ground pad via the common path.

19 Claims, 2 Drawing Sheets

(51) Int. Cl.
  *H04B 1/16*    (2006.01)
  *H04B 1/44*    (2006.01)
(58) Field of Classification Search
  CPC ........ H04B 1/1607; H04B 1/40; H04B 1/401;
        H04B 1/44; H03K 17/002; H03K 17/005;
        H03K 17/693; H03H 7/38; H03H 7/46;
              H03H 7/465; H03H 2007/386
  See application file for complete search history.

(56) References Cited

U.S. PATENT DOCUMENTS

| | | | | |
|---|---|---|---|---|
| 7,960,772 | B2* | 6/2011 | Englekirk | H03K 17/6871 |
| | | | | 455/127.1 |
| 9,143,123 | B2* | 9/2015 | Weiss | H03K 17/102 |
| 9,263,793 | B2* | 2/2016 | Dupuy | H01Q 5/335 |
| 9,531,413 | B2* | 12/2016 | Sun | H04B 1/0475 |
| 2014/0049312 | A1* | 2/2014 | Chih-Sheng | H04B 1/48 |
| | | | | 327/427 |
| 2018/0145707 | A1 | 5/2018 | Cheon | |
| 2020/0252042 | A1 | 8/2020 | Mori | |

OTHER PUBLICATIONS

European search report dated Mar. 15, 2023 for the EP application No. 22202791.4, filing date Oct. 20, 2022, p. 1-10.

\* cited by examiner

RADIO FREQUENCY SWITCH WITH MULTIPLE SHUNT PATHS SHARING A COMMON GROUND PAD

TECHNICAL FIELD

The present invention relates to a radio frequency (RF) switch, in particular to an RF switch in which multiple shunt paths share a ground pad and have good RF isolation.

BACKGROUND

In many wired or wireless communication systems, radio frequency (RF) switches are very important functional blocks. RF switches can be found in many different communication devices, such as mobile phones, wireless pagers, and wireless infrastructure, satellite communication, cable television, and other wireless communication equipment. In addition, because wireless communication equipment has a trend of shrinking in size, the shunt paths of the RF switch often share a common ground pad. In the case of sharing a grounding pad, how to isolate each shut path so that the RF switch would have good RF isolation has become an important issue when designing the RF switch.

SUMMARY

An embodiment of the present invention provides a radio frequency switch comprising an antenna end, a first signal end, a second signal end, a third signal end, a first series path, a second series path, a third series path, a first shunt path, a second shunt path, a common path, and a third shunt path. The first signal end is configured to transmit a first RF signal. The second signal end is configured to transmit a second RF signal. The third signal end is configured to transmit a third RF signal. The first series path comprises a first switch, a first end of the first switch is coupled to the first signal end, and a second end of the first switch is coupled to the antenna end. The second series path comprises a second switch, a first end of the second switch is coupled to the second end of the first switch and the antenna end, and a second end of the second switch is coupled to the second signal end. The third series path comprises a third switch, a first end of the third switch is coupled to the antenna end, the first switch and the second switch, and a second end of the third switch is coupled to the third signal end. The first shunt path is coupled between the first signal end and a node. The second shunt path is coupled between the second signal end and the node. The common path is coupled between the node and a first reference voltage end. The third shunt path is coupled between the third signal end and a second reference voltage end.

DETAILED DESCRIPTION

Figure 1:
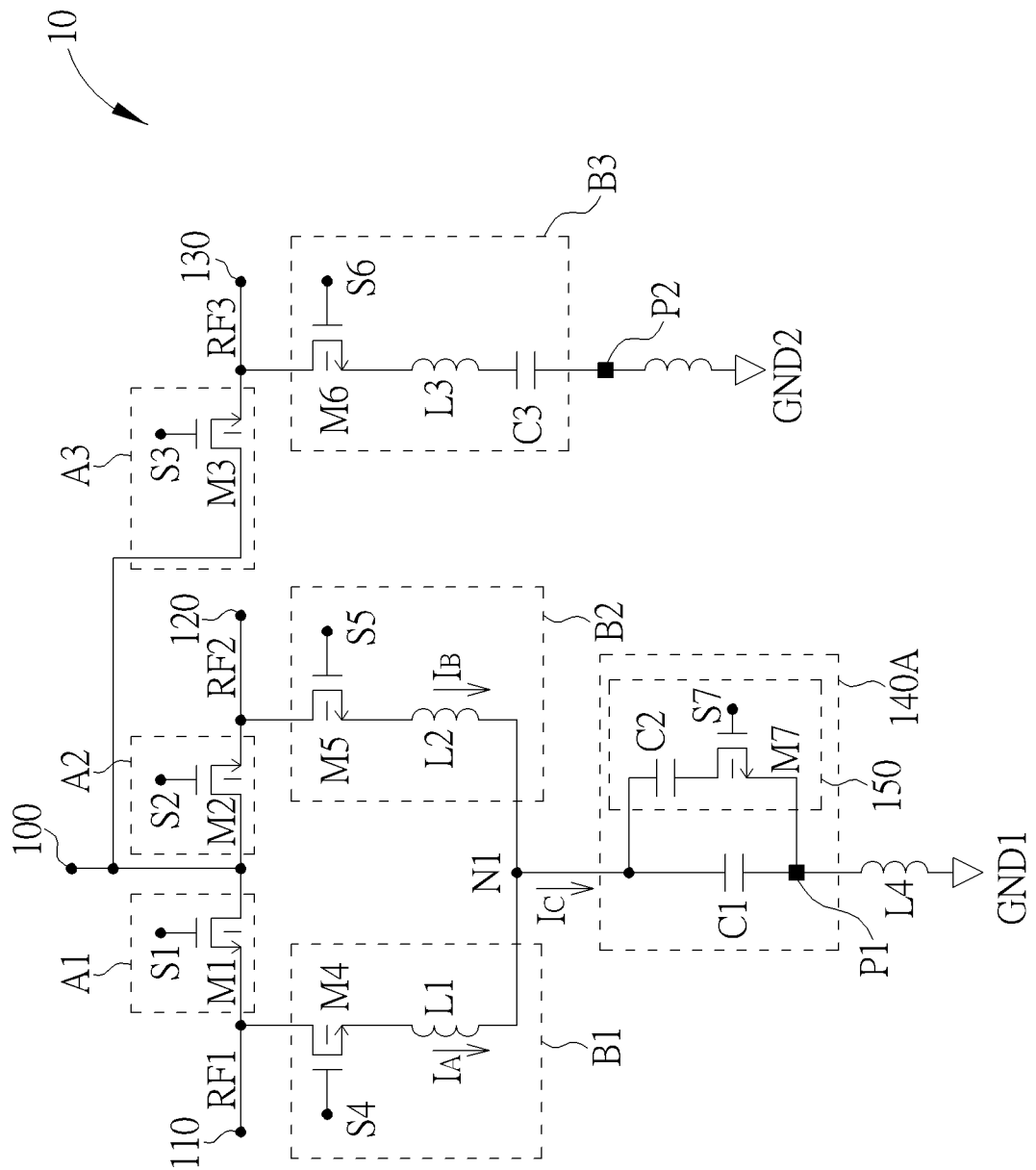
FIG. 1 is a circuit diagram of a radio frequency switch according to an embodiment of the present invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

Please refer to FIG. 1, which is a circuit diagram of a radio frequency (RF) switch 10 according to an embodiment of the present invention. The RF switch 10 comprises an antenna end 100, a signal end 110, a signal end 120, a signal end 130, a series path A1, a series path A2, a series path A3, a shunt path B1, a shunt path B2, a common path 140A, and a shunt path B3. The antenna end 100 is coupled to an antenna to receive RF signals from the antenna and transmit RF signals to the antenna. The signal end 110 is used to transmit an RF signal RF1, the signal end 120 is used to transmit an RF signal RF2, and the signal end 130 is used to transmit an RF signal RF3. The series path A1 comprises a switch M1. A first end of the switch M1 is coupled to the signal end 110, a second end of the switch M1 is coupled to the antenna end 100, and a control end of the switch M1 receives a control signal S1 to turn on/off the switch M1. The series path A2 comprises a switch M2. A first end of the switch M2 is coupled to the second end of the switch M1 and the antenna end 100, a second end of the switch M2 is coupled to the signal end 120, and a control end of the switch M2 receives a control signal S2 to turn on/off the switch M2. The series path A3 comprises a switch M3. A first end of the switch M3 is coupled to the antenna end 100, the switch M1, and the switch M2, a second end of the switch M3 is coupled to the signal end 130, and a control end of the switch M3 receives a control signal S3 to turn on/off the switch M3. The shut path B1 is coupled between the signal end 110 and a node N1. The shut path B2 is coupled between the signal end 120 and the node N1. The common path 140A is coupled between the node N1 and a reference voltage end GND1. The shut path B3 is coupled between the signal end 130 and another reference voltage end GND2. The voltage of the reference voltage end GND1 may be equal to the voltage of the reference voltage end GND2. In addition, the reference voltage end GND1 is coupled to a ground pad P1, and the reference voltage end GND2 is coupled to another ground pad P2. Since a current $I_A$ flowing through the shut path B1 and a current $I_B$ flowing through the shut path B2 both pass through the ground pad P1, the ground pad P1 is a common ground pad shared by the shut path B1 and the shut path B2. That is, the signal end 110 and the signal end 120 share the ground pad P1.

In the embodiment, the shut path B1 includes an inductor L1 and a switch M4 in series with the inductor L1, the shut path B2 includes an inductor L2 and a switch M5 in series with the inductor L2, and the shut path B3 includes an inductor L3, a switch M6, and a capacitor C3 connected in series. A first end of the switch M4 is coupled to the first end of the switch M1 and the signal end 110, a second end of the switch M4 is coupled to a first end of the inductor L1. A first end of the switch M5 is coupled to a second end of the switch M2 and the signal end 120, a second end of the switch M5 is coupled to a first end of the inductor L2, and a second end of the inductor L2 is coupled to a second end of the inductor L1. A first end of the switch M6 is coupled to the second end of the switch M3 and the signal end 130, a second end of the switch M6 is coupled to a first end of the inductor L3, a second end of the inductor L3 is coupled to a first end of the capacitor C3, and a second end of the capacitor C3 is coupled to the reference voltage end GND2.

The inductor L1, the inductor L2, and the inductor L3 may be real inductors, or may be formed by conductors (such as wires) of the RF switch 10, which have equivalent inductances. For example, the inductor L1 may be formed by a conductor connecting the second end of the switch M4 and the node N1, the inductor L2 may be formed by a conductor connecting the second end of the switch M5 and the node N1, and the inductor L3 may be formed by a conductor connecting the second end of the switch M6 and the capacitor C3. In addition, the switch M4 is used to control the electrical connection between the signal end 110 and the node N1, the switch M5 is used to control the electrical connection between the signal end 120 and the node N1, and the switch M6 is used to control the electrical connection between the signal end 130 and the reference voltage end GND2. A control end of the switch M4 receives a control signal S4 to turn on/off the switch M4, a control end of the switch M5 receives a control signal S5 to turn on/off the switch M5, and a control end of the switch M6 receives a control signal S6 to turn on/off the switch M6. The control signals S1 to S6 may be generated by a control circuit in a communication device where the RF switch 10 is located.

The common path 140A includes a resonant circuit having an adjustable capacitance. In the embodiment, the common path 140A comprises a capacitor C1 and a variable capacitance unit 150. A first end of the capacitor C1 is coupled to the node N1, and a second end of the capacitor C1 is coupled to the reference voltage end GND1. The variable capacitance unit 150 is connected in parallel with the capacitor C1, a first end of the variable capacitance unit 150 is coupled to the node N1, and a second end of the variable capacitance unit 150 is coupled to the second end of the capacitor C1 and the ground pad P1. In the embodiment, the variable capacitance unit 150 comprises a switch M7 and a capacitor C2. The capacitor C2 is coupled between the node N1 and a first end of the switch M7, and a second end of the switch M7 is coupled to the second end of the capacitor C1. A control end of the switch M7 receives a control signal S7 to turn on/off the switch M7. When the switch M7 is turned off, an equivalent capacitance of the common path 140A is equal to the capacitance of the capacitor C1. When the switch M7 is turned on, the capacitor C1 and the capacitor C2 are connected in parallel, so the equivalent capacitance of the common path 140A is equal to a sum of the capacitances of the capacitor C1 and the capacitor C2 (i.e., C1+C2). Therefore, by turning on/off the switch M7, the equivalent capacitance of the common path 140A is adjustable. In an embodiment of the present invention, the switch M7 and the capacitor C2 of the variable capacitance unit 150 can be replaced by a digital type varactor or an analog type varactor.

In the embodiment, the RF switch 10 is a single pole three throw (SP3T) RF switch, but the present invention is not limited thereto. The RF switch of the present invention can also be applied to a four-throw (4T) or more-throw architecture. In addition, the antenna end 100 of the RF switch 10 can only establish an electrical connection with one of the signal end 110, the signal end 120, and the signal end 130 at the same time. When the RF signal RF1 is transmitted between the antenna end 100 and the signal end 110, the switch M1 is turned on, the switch M2 is turned off, the switch M3 is turned off, the switch M4 is turned off, the switch M5 is turned on, the switch M6 is turned on, and the switch M7 is turned off. When the RF signal RF2 is transmitted between the antenna end 100 and the signal end 120, the switch M1 is turned off, the switch M2 is turned on, the switch M3 is turned off, the switch M4 is turned on, the switch M5 is turned off, the switch M6 is turned on, and the switch M7 is turned off. At this time, the inductor L1 and the common path 140A have a first resonance frequency. If the first resonance frequency is represented by f1, the first resonance frequency f1 can be represented by the following equation (1):

$$f1 = \sqrt{\frac{1}{L1 \times C1 + L4 \times C1}} \quad (1)$$

Where L4 represents an equivalent inductance between the ground pad P1 and the reference voltage end GND1, which can be formed by a conductor (such as a copper pillar or a solder ball) between the ground pad P1 and the reference voltage end GND1. Moreover, in the equation (1), the symbol L1 represents the inductance of the inductor L1, and the symbol C1 represents the capacitance of the capacitor C1.

In addition, when the RF signal RF3 is transmitted between the antenna end 100 and the signal end 130, the switch M1 is turned off, the switch M2 is turned off, the switch M3 is turned on, the switch M4 is turned on, the switch M5 is turned on, the switch M6 is turned off, and the switch M7 is turned on. The inductor L1, the inductor L2, and the common path 140A have a second resonance frequency. Assuming that the inductance of the inductor L1 is equal to the inductance of the inductor L2, and the current $I_A$ flowing through the inductor L1 is equal to the current $I_B$ flowing through the inductor L2, a current $I_C$ flowing through the common path 140A is equal to twice the current $I_A$ or twice the current $I_B$. That is, $I_C=2I_A=2I_B$. If the second resonance frequency is represented by f2, the second resonance frequency f2 can be represented by the following equation (2):

$$f2 = \sqrt{\frac{1}{\frac{L1 \times (C1+C2)}{2} + L4 \times (C1+C2)}} \quad (2)$$

In the equation (2), the symbol L1 represents the inductance of the inductor L1, the symbol L4 represents the equivalent inductance between the ground pad P1 and the reference voltage end GND1, the symbol C1 represents the capacitance of the capacitor C1, and the symbol C2 represents the capacitance of the capacitor C2. According to the equations (1) and (2), with the compensation of the capacitor C2, the second resonance frequency f2 can be adjusted to be equal to the first resonance frequency f1. On the one hand, when the RF signal RF3 is transmitted between the antenna end 100 and the signal end 130, the switch M3 is turned on, and the RF switch 10 would isolate the signal end 130 from the signal end 110 and the signal end 120 to prevent the signal end 110 and the signal end 120 from being affected by the RF signal RF3. On the other hand, when the RF signal RF2 is transmitted between the antenna end 100 and the signal end 120, the switch M2 is turned on, and the RF switch 10 would isolate the signal end 120 from the signal end 110 to prevent the signal end 110 from being affected by the RF signal RF2.

In addition, when the RF signal RF1 is transmitted between the antenna end 100 and the signal end 110, the inductor L2 and the common path 140A have a third resonance frequency. If the third resonance frequency is represented by f3, the third resonance frequency f3 can be represented by the following equation (3):

$$f3 = \sqrt{\frac{1}{L2 \times C1 + L4 \times C1}} \quad (3)$$

In the equation (3), the symbol L2 represents the inductance of the inductor L2, the symbol L4 represents the equivalent inductance between the ground pad P1 and the reference voltage end GND1, and the symbol C1 represents the capacitance of the capacitor C1. Wherein, when the inductance of the inductor L2 is equal to the inductance of the inductor L1, the third resonance frequency f3 is equal to the first resonance frequency f1. In addition, since the first resonance frequency f1 can be equal to the second resonance frequency f2, the third resonance frequency f3 can also be equal to the second resonance frequency f2. In other words, the first resonance frequency f1, the second resonance frequency f2, and the third resonance frequency f3 may be equal to each other. In addition, in another embodiment of the present invention, the inductance of the inductor L2 is not equal to the inductance of the inductor L1. However, by adjusting the capacitance of the variable capacitance unit 150, the third resonance frequency f3 can be adjusted to be equal to the first resonance frequency f1 and the second resonance frequency f2. In this way, the RF switch 10 would have good RF isolation.

Compared with the common path 140A in FIG. 1 comprising a resonant circuit with an adjustable capacitance, the common path may include a resonant circuit with an adjustable inductance in other embodiments of the present invention. Please refer to FIG. 2, which is a circuit diagram of an RF switch 20 according to another embodiment of the present invention. The main difference between the RF switch 20 and the RF switch 10 is that the common path 140A of the RF switch 10 is replaced by the common path 140B of the RF switch 20. In addition, other parts of the RF switch 20 can be the same as the RF switch 10, so the related descriptions will not be repeated. The common path 140B includes a capacitor C1 and a variable inductance unit 160. A first end of the capacitor C1 is coupled to the node N1. The variable inductance unit 160 is configured to provide a variable inductance. A first end of the variable inductance unit 160 is coupled to a second end of the capacitor C1, and a second end of the variable inductance unit 160 is coupled to the reference voltage end GND1. The variable inductance unit 160 may comprise a switch M7 and an inductor L5. A first end of the switch M7 and a first end of the inductor L5 are coupled to the second end of the capacitor C1, a second end of the switch M7 and a second end of the inductor L5 is coupled to a first end of the inductor L4, and a second end of the inductor L4 is coupled to the reference voltage end GND1. By turning on/off the switch M7, the equivalent inductance of the variable inductance unit 160 can be switched to L5 or zero, and the corresponding resonant frequency of the RF switch 20 can be adjusted, such that the RF switch 20 would have good RF isolation.

Figure 2:
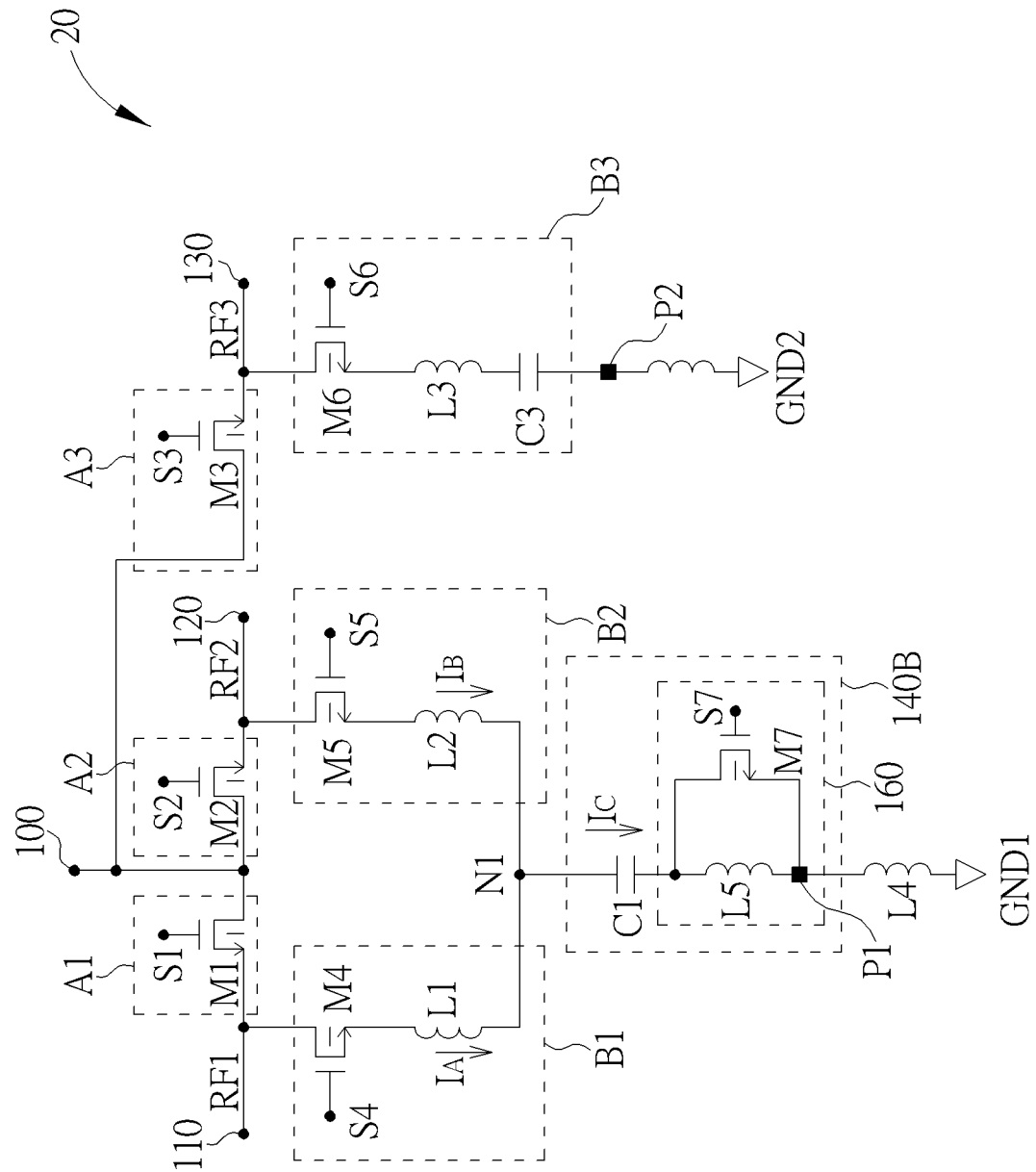
FIG. 2 is a circuit diagram of a radio frequency switch according to another embodiment of the present invention.

In the embodiment of FIG. 1, the capacitance of the resonant circuit of the common path 140A is adjusted. In the embodiment of FIG. 2, the inductance of the resonant circuit of the common path 140B is adjusted. In another embodiment of the present invention, the capacitance and the inductance of the resonant circuit of the common path would be adjusted simultaneously to adjust the corresponding resonant frequency of the RF switch, so that the RF switch would have good RF isolation.

In an embodiment of the present invention, the frequencies of the RF signals RF1, RF2, and RF3 are equal. For example, the frequencies of the RF signals RF1, RF2, and RF3 can all be 2.4 GHz or all equal to a specific frequency. In another embodiment of the present invention, the RF signal RF1 and the RF signal RF2 have the same frequency band, and the frequency band of the RF signal RF3 is different from the frequency band of the RF signals RF1 and RF2. For example, the RF signal RF1 and the RF signal RF2 are in a 5th generation mobile network (5G) frequency band, and the RF signal RF3 is in a 4th generation mobile network (4G) frequency band. In another embodiment of the present invention, the frequency bands of the RF signals RF1, RF2, and RF3 are different from each other.

In an embodiment of the present invention, the distance between the signal end 130 and the antenna end 100 is less than the distance between the signal end 110 and the antenna end 100, and/or the distance between the signal end 120 and the antenna end 100. As a result, the signal end 130 has a better harmonic filtering effect than the signal end 110 and/or the signal end 120.

According to the above-mentioned embodiments, two shut paths of the RF switch of the present invention share a common ground pad. By adjusting the capacitance and/or inductance of the common path, the corresponding resonance frequency of the RF switch can be adjusted so that the RF switch would have good RF isolation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) switch, comprising:
   an antenna end;
   a first signal end configured to transmit a first RF signal;
   a second signal end configured to transmit a second RF signal;
   a third signal end configured to transmit a third RF signal;
   a first series path comprising a first switch, a first end of the first switch being coupled to the first signal end, and a second end of the first switch being coupled to the antenna end;
   a second series path comprising a second switch, a first end of the second switch being coupled to the second end of the first switch and the antenna end, and a second end of the second switch being coupled to the second signal end;
   a third series path comprising a third switch, a first end of the third switch being coupled to the antenna end, the first switch and the second switch, and a second end of the third switch being coupled to the third signal end;
   a first shunt path coupled between the first signal end and a node;
   a second shunt path coupled between the second signal end and the node;
   a common path coupled between the node and a first reference voltage end; and
   a third shunt path coupled between the third signal end and a second reference voltage end; wherein the common path comprises an adjustable resonance circuit.

2. The RF switch of claim 1, wherein a capacitance and/or an inductance of the adjustable resonance circuit is adjustable.

3. The RF switch of claim 1, wherein when the first RF signal is transmitted between the antenna end and the first signal end, the common path has a first capacitance;

wherein when the second RF signal is transmitted between the antenna end and the second signal end, the common path has a second capacitance;

wherein when the third RF signal is transmitted between the antenna end and the third signal end, the common path has a third capacitance; and wherein the third capacitance is different from the first capacitance and the second capacitance.

4. The RF switch of claim 3, wherein the first shunt path comprises a first inductor, and the second shunt path comprises a second inductor;

when the second signal flows through the antenna end and the second signal end, the first inductor and the common path have a first resonance frequency; and when the third signal flows through the antenna end and the third signal end, the first inductor, the second inductor, and the common path have a second resonance frequency, and the second resonance frequency is equal to the first resonance frequency.

5. The RF switch of claim 4, wherein the first shunt path further comprises a fourth switch, the second shunt path further comprises a fifth switch, the fourth switch is connected in series with the first inductor, the fifth switch is connected in series with the second inductor, a first end of the fourth switch is coupled to the first end of the first switch and the first signal end, a second end of the fourth switch is coupled to a first end of the first inductor, a first end of the fifth switch is coupled to the second end of the second switch and the second signal end, a second end of the fifth switch is coupled to a first end of the second inductor, and a second end of the first inductor is coupled to a second end of the second inductor.

6. The RF switch of claim 4, wherein when the first RF signal is transmitted between the antenna end and the first signal end, the second inductor and the common path have a third resonance frequency, and the third resonance frequency is equal to the first resonance frequency and the second resonance frequency.

7. The RF switch of claim 3, wherein the common path comprises:

a first capacitor, a first end of the first capacitor is coupled to the node, and a second end of the first capacitor is coupled to the first reference voltage end; and a variable capacitance unit is connected in parallel with the first capacitor, a first end of the variable capacitance unit is coupled to the node, and a second end of the variable capacitance unit is coupled to the second end of the first capacitor.

8. The RF switch of claim 7, wherein the variable capacitance unit is selected from a group consisting of a digital type varactor and an analog type varactor.

9. The RF switch of claim 7, wherein the variable capacitance unit comprises a switch and a second capacitor, the second capacitor is coupled between the node and a first end of the switch, and a second end of the switch is coupled to the second end of the first capacitor.

10. The RF switch of claim 1, wherein the first shunt path comprises a fourth switch configured to control electrical connection between the first signal end and the node, and the second shunt path comprises a fifth switch configured to control electrical connection between the second signal end and the node, and the third shunt path comprises a sixth switch configured to control electrical connection between the third signal end and the second reference voltage end.

11. The RF switch of claim 10, wherein when the first RF signal is transmitted between the antenna end and the first signal end, the first switch is turned on, the second switch is turned off, the third switch is turned off, the fourth switch is turned off, the fifth switch is turned on, and the sixth switch is turned on.

12. The RF switch of claim 10, wherein when the second RF signal is transmitted between the antenna end and the second signal end, the first switch is turned off, the second switch is turned on, the third switch is turned off, the fourth switch is turned on, the fifth switch is turned off, and the sixth switch is turned on.

13. The RF switch of claim 10, wherein when the third RF signal is transmitted between the antenna end and the third signal end, the first switch is turned off, the second switch is turned off, the third switch is turned on, the fourth switch is turned on, the fifth switch is turned on, and the sixth switch is turned off.

14. The RF switch of claim 1, wherein frequencies of the first RF signal, the second RF signal and the third RF signal are equal.

15. The RF switch of claim 1, wherein the first RF signal and the second RF signal have a same frequency band, and a frequency band of the third RF signal is different from the frequency band of the first RF signal and the second RF signal.

16. The RF switch of claim 1, wherein frequency bands of the first RF signal, the second RF signal and the third RF signal are different from each other.

17. The RF switch of claim 1, wherein the common path comprises:

a first capacitor, a first end of the first capacitor is coupled to the node; and a variable inductance unit, a first end of the variable inductance unit is coupled to a second end of the first capacitor, and a second end of the variable inductance unit is coupled to the first reference voltage end.

18. The RF switch of claim 17, wherein the variable inductance unit comprises a switch and a third inductor, a first end of the switch and a first end of the third inductor are coupled to the second end of the first capacitor, a second end of the switch and a second end of the third inductor are coupled to a first end of a fourth inductor, and a second end of the fourth inductor is coupled to the first reference voltage end.

19. The RF switch of claim 1, wherein the voltages of the first reference voltage end and second reference voltage end are the same.

* * * * *